United States Patent Office 3,595,719
Patented July 27, 1971

3,595,719

METHOD OF BONDING AN INSULATOR MEMBER TO A PASSIVATING LAYER COVERING A SURFACE OF A SEMICONDUCTOR DEVICE

Daniel I. Pomerantz, Lexington, Mass., assignor to P. R. Mallory & Co., Inc., Indianapolis, Ind.

No Drawing. Filed Nov. 27, 1968, Ser. No. 779,615
Int. Cl. H01l 7/00
U.S. Cl. 156—17 7 Claims

ABSTRACT OF THE DISCLOSURE

A process for forming a bond between an insulator member and a passivating layer covering a surface of a semiconductor device by etching the passivating layer to be bonded with an etchant and thereafter bonding the insulator member to the semiconductor device by the application of heat and electric potential thereto.

The present invention relates to a process for bonding an insulator member to a passivating layer overlaying a surface of a semiconductor device and, more particularly, to a process for bonding a glass member to an oxidized surface of a silicon semiconductor device.

Insulative or passivating films are extensively used in the manufacture of semiconductor devices for, in general, three major purposes: as a mask for diffusants to localize diffusion, as a dielectric for capacitors, and as an insulator between conductors. It is possible for a single passivating film to serve any or all of these purposes, as well as others, simultaneously. Hereinafter, the terms "passivating film" and "passivating layer" will be used to denote any such surface film, regardless of the particular function within the completed device; the term "passivating material" will denote the material of which the passivating film or layer is composed.

In conventional practice, passivating films, such as silicon oxide films, are grown thermally to a desired thickness over the entire surface of a semiconductor slice in an atmosphere of steam or wet oxygen at a temperature of approximately 1200° C. Portions of the film are then removed by masking and chemical etching using photolithographic techniques to define the filmed areas to be removed. A standard sequence for carrying out one planar diffusion for fabricating an integrated circuit involves the following steps: (1) passivation of the surface of the slice, usually by oxidation; (2) application of photoresist to the passivating layer; (3) bakeout of the photoresist; (4) registration of a mask and exposure of the photoresist; (5) development of the photoresist; (6) etching away portions of the passivating film; (7) removal of the photoresist material; and (8) diffusion of impurities into the semiconductor through windows in the passivating film. In the fabrication of an integrated circuit, this sequence must be repeated once for each of four or five diffusions, and must be interspersed with other steps involving cleaning of the slice, epitaxial deposition and metallization.

An insulator member can, among other things, be bonded to protect the semiconductor device from environmental conditions and the like. In some instances an insulator to passivating layer bond of sufficient strength and, when desired, a degree of hermeticity is difficult to achieve particularly when the device contains p-n junctions made by dopants, such as boron, and/or the passivating layer is relatively thick. As can be appreciated therefore, a method for forming an improved bond in instances such as the foregoing would represent an advancement in this art.

In general, the process of the present invention is directed to achieving an improved bond between an insulating member and a passivating layer covering a surface of a semiconductor device by etching the passivating layer to be bonded with an etchant and thereafter bonding the insulator member to the semiconductor device, all of which will be more fully discussed hereinafter. The process results in a strong bond being formed between the insulative member and the semiconductor device.

Etchants or etching solutions generally useful in the present invention include acids or bases, in some instances in a buffered condition, capable of etching the passivating layer. Typical examples include concentrated alkali metal hydroxides, such as sodium hydroxide and potassium hydroxide, hydrofluoric acid, and various mixtures of inorganic acids, such as chromic acid, nitric acid, hydrochloric acid containing hydrofluoric acid. Some passivating layers, such as, silicon nitride can also be etched using inorganic acids such as phosphoric acid and the like. The rate of reaction of the etchant on the passivating layer can be varied by, among other things, varying the amount of buffering, concentration of the etchant and/or etchant temperature.

In general, the passivating layer, generally having a thickness no greater than about 20,000 A. can be etched to any desired thickness but at least a thickness of about 1,000 A. should remain as the etched layer prior to bonding the insulator material thereto.

Insulative members which can be used in accordance with the process of the present invention include inorganic insulating materials such as the glasses including borosilicate glasses, soft glasses and hard glasses, as well as quartz, ceramics such as porcelain, alumina, and the like. Preferred insulators are glass and ceramics, particularly those ranging in a thickness of from about 5 mils to about 500 mils and, more particularly, from about 10 mils to about 60 mils.

The bonding of the insulator member to the pretreated passivating layer of the semiconductor device can be carried out by the application of heat and electric potential. In general, these factors, that is, temperature and electric potential, as well as time and the like are all interrelated considerably. The insulator member is heated to render it more electrically conductive and in the process of the present invention the temperature will vary dependent upon the type or specific composition of the insulator material. The bonding temperature is, however, below the softening point of the insulator member and is usually within the range of 150° C. to 1200° C. When the insuator is a borosilicate glass such as the type obtainable from the Corning Glass Works under the trademark "Pyrex" the preferred range is about 300° C. to 700° C. For the soft glasses the temperature will be in the range of about 150° C. to 500° C., and for quartz glass the temperature will be in the range of about 650° C. to 1200° C.

An electric potential is applied across the composite unit, that is, the insulator member and the passivating layer of the semiconductor device. The electric potential preferably in most cases is a direct current potential, but may be a pulsating direct current potential, or in some cases an alternating current power potential, particularly of a low frequency.

The type of power source which provides the electric potential and, in the case of direct current, the polarity as applied to the unit may depend in some cases upon the type of insulator and semiconductor device being used and particularly whether the insulator has a symmetric potential distribution characteristic or an asymmetrical potential distribution characteristic. Potential distribution characteristics for insulators and methods for determining them are well known in the art and fully documented in the literature. The borosilicate glasses in general and particularly Pyrex No. 7740 are asymmetrical in character and for optimum bonding where the insulator, for example, is Pyrex, it should be made negative with respect to the semiconductor device. Where the insulator has a symmetrical distribution characteristic the polarity may be in either direction.

Although the exact phenomenon which occurs in the bonding operation is not readily determinable, it is believed to be due principally to an electrostatic force which is generated at the interface between the insulator member and the passivating layer of the semiconductor device when a potential is applied across the assembled composition unit. When the elements are brought together, though they may have very smooth and complemental surfaces, there is initially intimate contact at only spaced points with intervening gaps. Then when the potential is applied across the unit and electric current flow ensues, electrostatic attractive forces draw the materials together closing, usually progressively, the gaps. The heating of the insulator increases its electrical conductivity and promotes the generation of the electrostatic forces and the bonding.

The applied voltage, the current density and the time are not critical and may vary within wide ranges. In general, the potential will be in the range from about 200 volts up to perhaps 5000 volts or more. No very definite value for the current density can be stated particularly since, if the applied potential is maintained constant, the current density gradually decreases from, for example, a value in the range of 100 to 300 or more microamperes/$cm.^2$ to a very small value as the bond progresses. In general a finite current of low value serves the purpose. In general, the higher the potential and corresponding current the lesser the time required and conversely. As a practical matter the current commonly will be in the range 3 to 20 microamperes/$mm.^2$ and the time in the range of minutes, usually less than about 20 minutes.

Many and various bonding apparatuses can be utilized in carrying out the process of the present invention and such include positioning the composite upon a heated metal platen which is provided with a terminal connected to a power source and the insulator member of the composite can be provided with an electrode or terminal positioned upon an exposed surface thereof and connected to the aforementioned power source.

The following example is presented to illustrate the invention.

A silicon dioxide layer of about 10,000 A. thickness covering a planar silicon semiconductor having diffused p-n junctions is etched by contacting the silicon oxide surface for about 10 to 60 seconds with a mixture of 1 part conc. HF (48% by weight) and 1 part water. The oxide layer is partially etched with the etched layer having a thickness of about 5,000 A. A borosilicate glass is then bonded to the etched layer using a temperature in the range of about 400° C. to about 600° C., a voltage in the range of about 500 volts to about 3,000 volts and a bonding time in the order of less than about 5 minutes.

Although particular mention has been made of silicon and silicon dioxide because of their presently widespread use in solid-state devices, other semiconductors and other passivating films may also find application with the present invention. Examples of such semiconductors may include germanium, silicon carbide, gallium arsenide, gallium phosphide, indium, antimonide, lead telluride, cadmium sulfide and cadmium fluoride. Representative examples of passivating materials which may be useful with the present invention include silicon monoxide, silicon nitride, germanium dioxide, germanium nitride, gallium oxide and gallium phosphate. The passivating material need not contain as a constituent the semiconductor material on which it is deposited; for example, a passivating film of silicon dioxide may be grown on or removed from a germanium semiconductor.

What is claimed is:

1. In a method for bonding an insulator member to a passivating layer covering a surface of a semiconductor device by the application of heat and an electric potential across the member and the device whereby an electrostatic force attracts the surfaces of the member and device into intimate contact and effects a bond therebetween, the improvement comprising prior to said bonding etching the passivating layer to a thickness of a least about 1,000 A. with an etchant.

2. A process according to claim 1, wherein said semiconductor device contains diffused p-n junctions.

3. A process according to claim 2, wherein said insulator member is glass.

4. A process according to claim 3, wherein said glass has a thickness of from about 5 mills to about 500 mils.

5. A process according to claim 4, wherein said etchant is an aqueous acidic solution.

6. A process according to claim 5, wherein said semiconductor device is silicon and said passivating layer is silicon dioxide.

7. A process according to claim 6, wherein said etchant is aqueous hydrofluoric acid.

References Cited

UNITED STATES PATENTS

| | | | |
|---|---|---|---|
| 3,219,482 | 11/1965 | Jenkin | 117—213 |
| 3,224,904 | 12/1965 | Klein | 156—17X |
| 3,231,422 | 1/1966 | Emeis | 156—17X |
| 3,256,598 | 6/1966 | Kramer et al. | 156—272X |
| 3,309,760 | 3/1967 | Reznick et al. | 117—213X |
| 3,393,091 | 7/1968 | Hartmann et al. | 117—213X |
| 3,397,278 | 8/1968 | Pomerantz | 174—52 |
| 3,417,459 | 12/1968 | Pomerantz et al. | 204—16X |
| 3,420,705 | 1/1969 | Topas | 156—17X |
| 3,436,284 | 4/1969 | Klein | 156—17 |
| 3,436,287 | 4/1969 | Lange | 156—17 |

JOHN T. GOOLKASIAN, Primary Examiner

J. C. GIL, Assistant Examiner

U.S. Cl. X.R.

29—584; 156—272; 174—525; 204—16